United States Patent
Tong et al.

[11] Patent Number: 5,290,416
[45] Date of Patent: Mar. 1, 1994

[54] UNIDIRECTIONAL FIELD GENERATOR

[75] Inventors: Hua-Ching Tong; John J. Newman, both of San Jose; Hon-Sian J. Wu, Fremont, all of Calif.

[73] Assignee: Read-Rite Corporation, Milpitas, Calif.

[21] Appl. No.: 911,457

[22] Filed: Jul. 10, 1992

[51] Int. Cl.$^5$ .............................................. C23C 14/34
[52] U.S. Cl. ........................... 204/298.16; 204/192.12
[58] Field of Search ..................... 204/298.16, 192.12

[56] References Cited
U.S. PATENT DOCUMENTS
5,045,166  9/1991  Bobbio ........................... 204/192.32

Primary Examiner—Aaron Weisstuch
Attorney, Agent, or Firm—Nathan N. Kallman

[57] ABSTRACT

An apparatus for depositing magnetic material on a substrate uses a magnet assembly formed of permanent magnet pieces that provide a uniaxial magnetic field. The magnet assembly is preferably made from ceramic magnetic tiles that are joined to form an arcuate strip. The permanent magnet strip is located external to the deposition chamber and positioned so that the magnetic flux lines traverse a workpiece or wafer seated within the chamber.

12 Claims, 3 Drawing Sheets

UNIDIRECTIONAL FIELD GENERATOR

FIELD OF THE INVENTION

This invention relates to a magnetic field generator and in particular to a means for providing a unidirectional magnetic field to a sputtering apparatus used for the deposition of thin films of magnetic material.

DESCRIPTION OF THE PRIOR ART

During the production of thin film magnetic heads, thin films of a magnetic material, such as Permalloy, are deposited onto a wafer that is positioned in a sputter chamber. The magnetic yoke for each thin film head comprises first and second shaped thin film layers, designated as P1 and P2 layers. Very thin seed layers of Permalloy are deposited prior to the deposition of the P1 and P2 layers respectively. Thus for each of the P1 and P2 layers, there are two steps of depositing thin films of magnetic material. Therefore the direction of anisotropy of the seed layer will conflict with the direction of anisotropy of the succeeding Permalloy layer if the two directions are not aligned. To provide a path for electrical current representing the write or read signals processed by the magnetic head, a thin film of copper coil is formed between the P1 and P2 layers.

While the Permalloy material is being sputtered onto the wafer to form the seed layers for the P1 and P2 layers, a magnetic field is applied to induce the magnetic moments of the magnetic material to be oriented along a direction of easy magnetization. Typically, the magnetic field is generated by a magnet assembly, including permanent magnet pieces located on a bed or table within the sputter chamber. The magnet assembly includes soft iron material between the magnets. In addition, prior art field generators use a relatively large electrical coil that is disposed adjacent to the outer wall of the sputter chamber. High current and power levels are used to generate a magnetic field.

After each of the different deposition processes, the sputter chamber is evacuated and the wafer is removed from the sputter chamber. Parts and fixtures of the sputter chamber, including permanent magnets used during the deposition process, are also removed for cleaning and subsequent reinstallation. These removable components are heavy and cumbersome and their removal and reinstallation are difficult and time-consuming.

SUMMARY OF THE INVENTION

An object of this invention is to provide a magnetic field generating means that realizes uniaxial anisotropy along a predetermined direction.

Another object of this invention is to provide a means for aligning the magnetic moments of magnetic films within a conventional sputtering or evaporation system.

Another object is to provide a field generator that produces a magnetic field with improved unidirectional stability over a defined region of space.

According to this invention, a unidirectional magnetic field generator comprises a plate or strip of permanent magnets disposed in an array. The permanent magnets are arranged in rows and columns so that all poles of like polarity are aligned in a desired orientation. The permanent magnet strip is positioned close to the outer wall of a sputter chamber within which a workpiece or substrate is positioned. The permanent magnet strip provides a magnet field having flux lines which are substantially uniaxial. The uniaxial field is projected into the chamber and across the area of the substrate.

BRIEF DESCRIPTION OF THE DRAWINGS

The invention will be described in greater detail with reference to the drawings in which.

DETAILED DESCRIPTION OF THE PREFERRED EMBODIMENT

Figure 1:
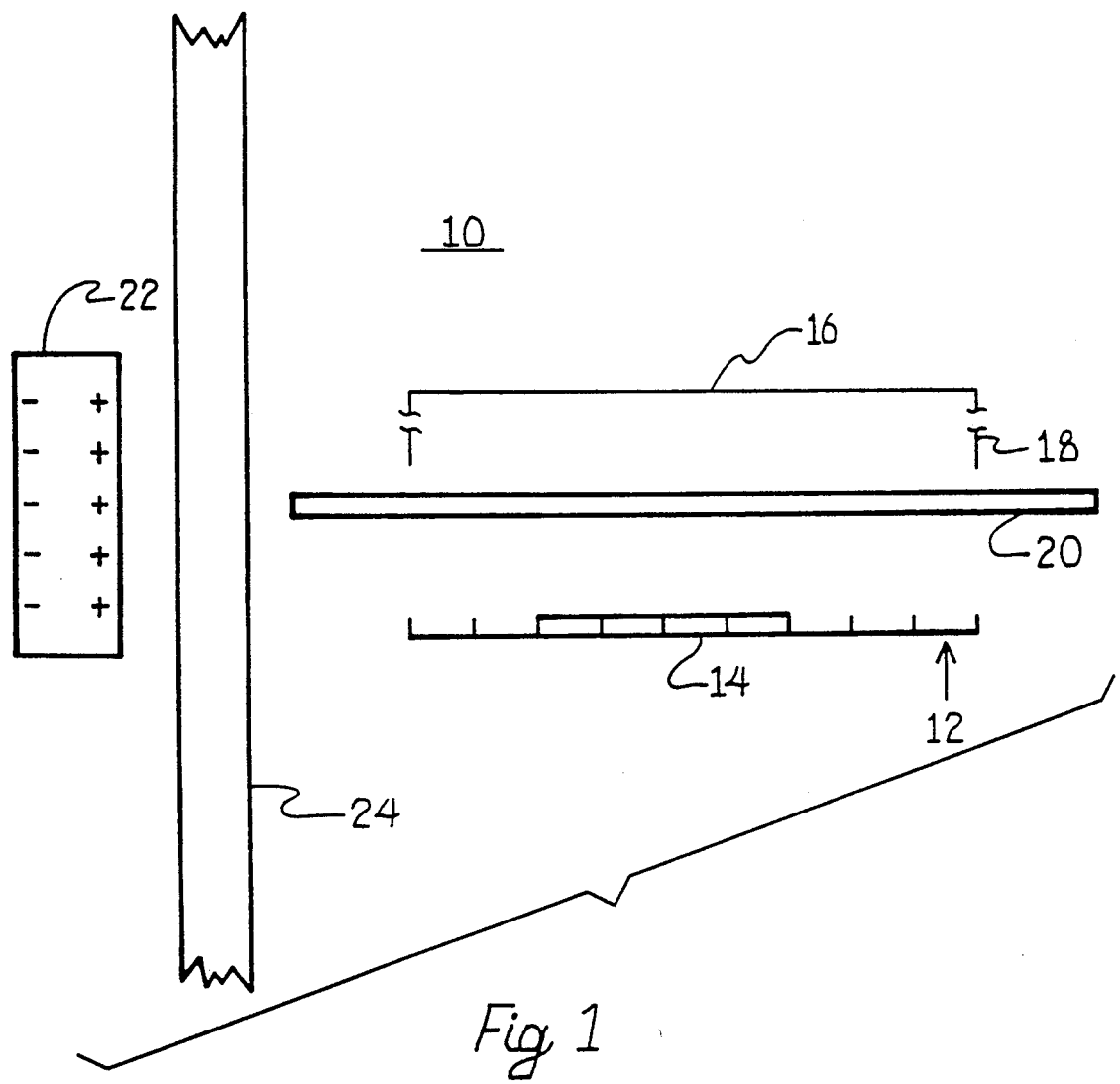
FIG. 1 is a cross-sectional front view representation of a sputter chamber, partially shown, with an external permanent magnet means, in accordance with this invention.

FIG. 1 illustrates a sputter chamber 10, partially shown, which encloses a substrate carrier or turntable 12 on which a workpiece or wafer 14 is seated. The surface of the wafer 14, on which magnetic material is to be deposited, is in juxtaposition with a closely spaced target 16. During operation, the target serves as a cathode electrode and is biased at a selected voltage, in the range of $-1000$ volts to $-2000$ volts for example. The turntable 12 is maintained at a reference voltage, such as ground or a negative voltage, and serves as the anode electrode. A metal shield 18 that is maintained at ground potential is provided around the target 1 to prevent sputtered material from migrating in directions other than in the direction of the wafer 14 and to avoid contamination of parts and fixtures located at the backside of the target cathode. A shutter 20, which is fixed between the target 16 and the wafer 14, is adapted to be opened and closed to control the sputtering process. A gas, such as Argon, is introduced into the chamber to provide the necessary environment and is maintained at a pressure of about 10–30 microns during the deposition process.

During the deposition of the Permalloy seed layers and the P1 and P2 layers when forming thin film heads, a unidirectional or uniaxial magnetic field is provided across the area of the wafer, in accordance with this invention. The magnetic field acts to align the magnetic moments of the magnetic material that is deposited to ensure stability of the magnetic heads during the recording mode in a data processing system.

Figure 2:
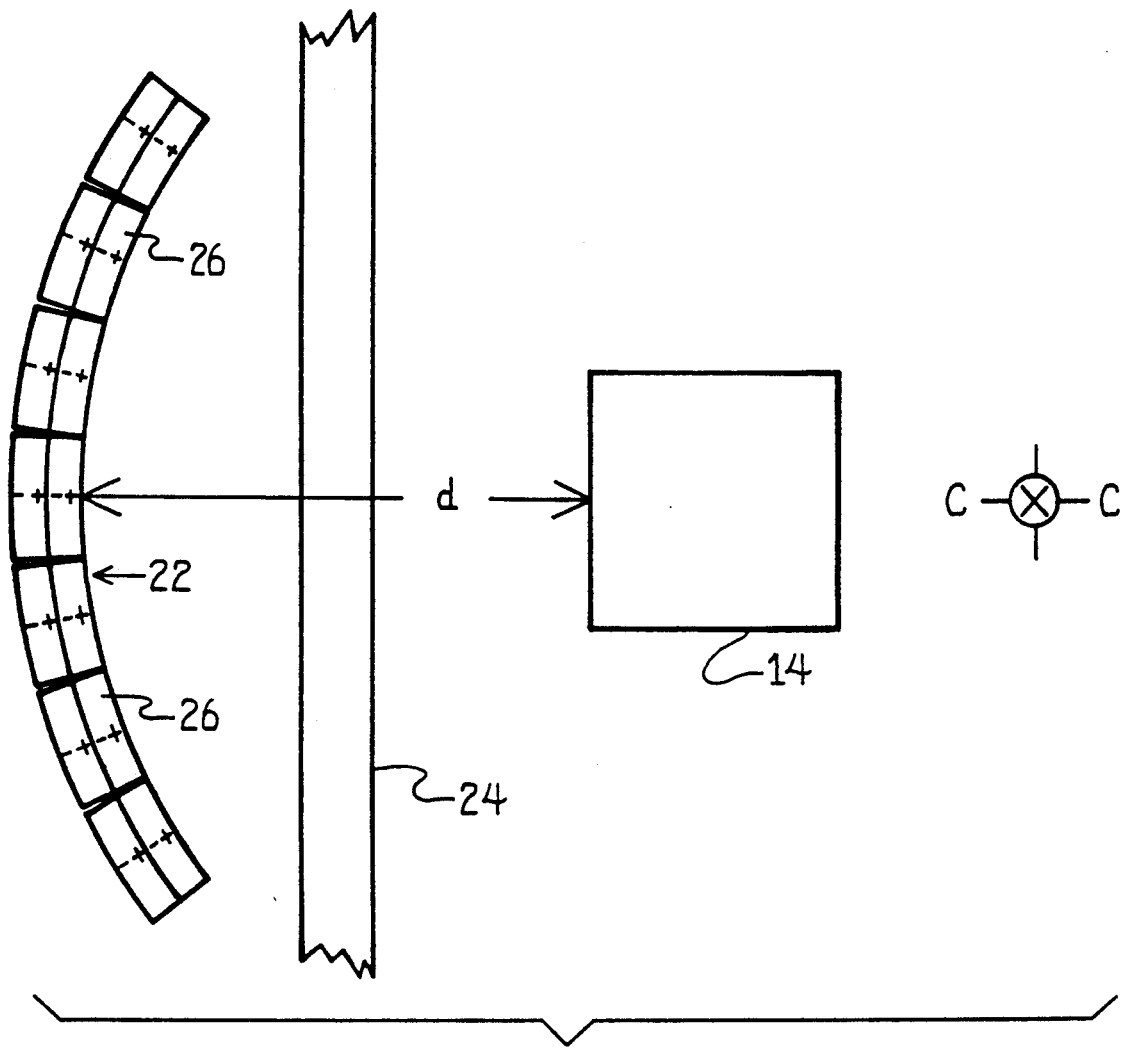
FIG. 2 is a top view representation illustrating the position of a permanent magnet assembly relative to a wafer.

To achieve the uniaxial magnetic field, a permanent magnet assembly 22 is positioned closely adjacent and external to the housing wall 24 of the sputter chamber 10. The permanent magnet assembly 22 is attached on the outside of the chamber wall 24, or alternatively on a bed or table in a fixed position close to the chamber wall. The permanent magnet assembly, which is shown in cross-section taken across a center of the assembly 22 shown in FIG. 2, is positioned so that the magnetic flux lines which emanate from the magnets flow through the chamber wall 24 towards the wafer 14 and across the area around the wafer. The unidirectional magnetic field applied to the Permalloy that is deposited on the wafer shifts the magnetic moments of the Permalloy material into a preferred alignment, thereby ensuring head stability during the recording of data signals.

In keeping with this invention, the permanent magnet assembly is formed with a multiplicity of permanent magnets comprising rectangular ceramic tiles 26 arranged in a stack of rows and columns, as shown in FIG. 2. The permanent magnet tiles 26 are joined by an epoxy adhesive, for example, or other suitable attachment means. In this specific embodiment, seven tiles 26 are set in a row and two rows of seven columns are used. Each tile 26 is about 1.875 inches long, 0.875 inch high and 0.380 inch thick. The polarities of the magnets are aligned so that the same polarity portions face towards the wafer on the turntable. The permanent magnet assembly is configured to be preferably arcuate so that the outer flux lines of the magnetic field are directed to be in a substantially unidirectional orientation relative to the flux lines at the center of the field.

In the embodiment shown in FIG. 2, the center of the permanent 33 magnet assembly 22 is located at a nominal distance between 5-7 inches from the closest edge of a four inch wafer 14. The field intensity is such that the flux extends across the entire wafer. For example, a nominal field of about 10-20 oersteds is obtained at the end of the wafer furthest from the magnet assembly 22.

Figure 3:
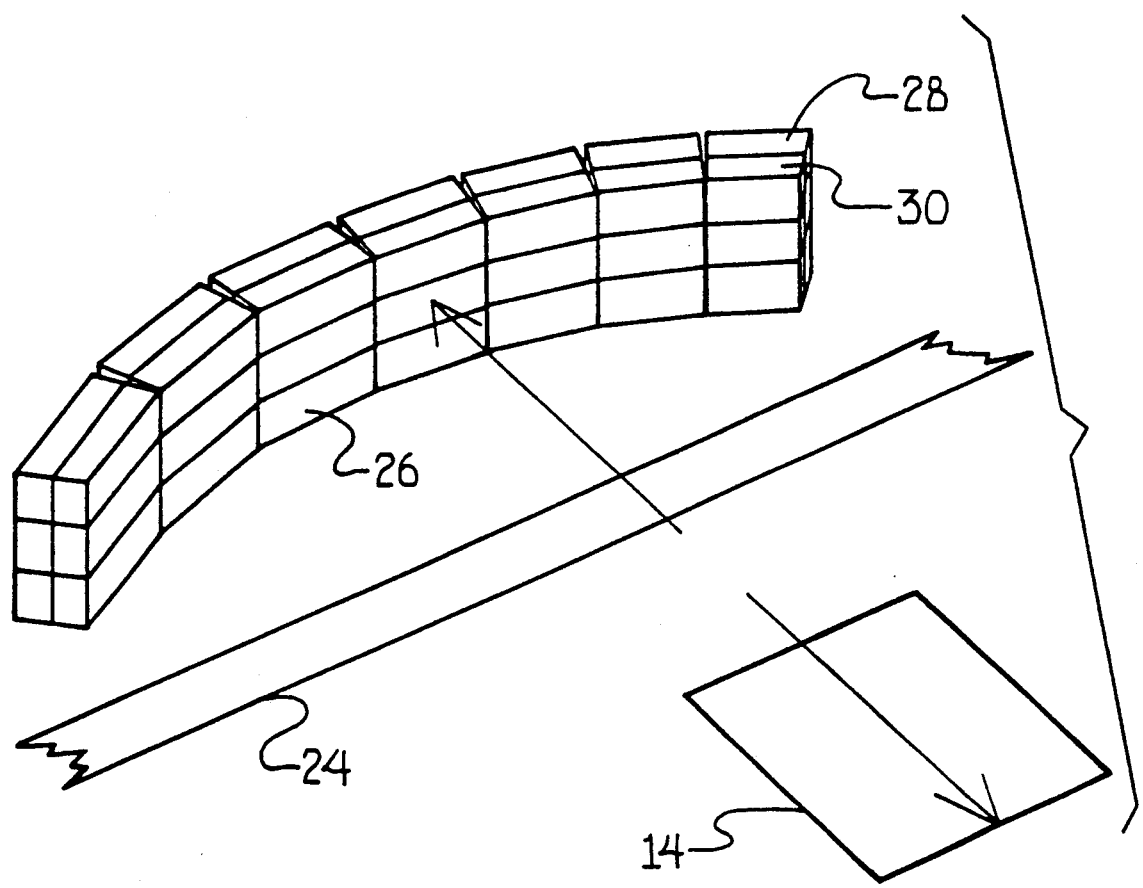
FIG. 3 is an isometric representation of the permanent magnet strip positioned relative to a wafer.

FIG. 3 depicts an alternative view of the permanent magnet assembly, made in accordance with this invention. In FIG. 3, the magnet assembly is formed with two abutting stacks 28 and 30. Each stack includes three rows and seven columns of permanent magnet tiles 26 that form the magnet assembly. The overall arcuate length of the assembly is more than twelve inches. The flux density of the material used in the magnet assembly is approximately 4000 Gauss nominal or 2400 oersteds nominal. The effective field extends at least 11 inches from the magnetic assembly to the furthest end of the wafer 14. Although field strength decreases with distance from the permanent magnet source, the effective field supplied by the magnet assembly acts to align the magnetic moments of the Permalloy material that is deposited on the wafer.

By virtue of this invention, the need for a large heavy coil which uses high levels of current and power in a magnet assembly is eliminated. Also there is no need to remove heavy permanent magnets from the sputter chamber, as practised with prior art deposition apparatus, for cleaning the parts of the chamber after each deposition of a different layer. The uniaxial magnetic field that is generated by the simplified, low cost permanent magnet assembly of this invention ensures that the magnetic moments of the magnetic material being processed in the chamber are properly aligned. The alignment of the magnetic moments of the Permalloy allows thin film magnetic heads to operate in a stable manner during recording of data signals.

It should be understood that the invention is not limited to the specific materials, dimensions, parameters or configurations disclosed herein. It is apparent that the magnet assembly disclosed herein may be used with other systems which require a substantially unidirectional magnetic field.

We claim:

1. An apparatus for depositing magnetic material on a substrate, comprising:
    a sputter chamber enclosed by a housing wall;
    a support positioned within said chamber on which said substrate is adapted to be seated;
    a permanent magnet assembly formed as a single integrated structure located external to and spaced from said housing wall, said assembly comprising a multiplicity of permanent magnet pieces disposed in rows and columns, said single structure being formed of a continuous array of said permanent magnetic pieces, all of said pieces being joined to form said continuous array, said magnet assembly providing a uniaxial magnetic field across the area of said substrate and being formed without a flux return element, so that the magnetic moments of said magnetic material are aligned during the deposition process.

2. An apparatus as in claim 1, wherein said permanent magnet pieces are ceramic tiles.

3. An apparatus as in claim 1, wherein said permanent magnet pieces are joined to form a stack of rows and columns.

4. An apparatus as in claim 3, wherein said stack is formed with at least two rows and seven columns.

5. An apparatus as in claim 3, wherein said stack of permanent magnet pieces has an arcuate configuration.

6. An apparatus as in claim 1, wherein said permanent magnet pieces each are about 1.875 inches long, 0.875 inch high and 0.380 inch thick.

7. An apparatus as in claim 6, wherein said assembly is more than 12 inches in length.

8. An apparatus as in claim 1, wherein said assembly provides a uniaxial magnetic field from a magnetic material with a flux density of about 4000 gauss nominal.

9. An apparatus as in claim 1, wherein said chamber includes a target that is adapted to be biased at $-1000$ to $-2000$ volts relative to a reference voltage.

10. An apparatus as in claim 1, wherein said chamber is adapted to include an environment of Argon maintained at a pressure of about 10-30 microns.

11. An apparatus as in claim 1, wherein said permanent magnet assembly is in a fixed position on a bed or table close and external to said housing wall, so that magnetic flux from said magnet pieces flow through said wall to and across the area of said substrate.

12. An apparatus as in claim 1, wherein said rows and columns of permanent magnet pieces are disposed in abutting stacks, all of said magnet pieces being joined to form a single continuous integral permanent magnet.

* * * * *